US010736225B2

(12) United States Patent
Choi et al.

(10) Patent No.: US 10,736,225 B2
(45) Date of Patent: *Aug. 4, 2020

(54) DISPLAY DEVICE

(71) Applicant: SAMSUNG DISPLAY CO., LTD., Yongin-si, Gyeonggi-do (KR)

(72) Inventors: Sung Chul Choi, Hwaseong-si (KR); Young Eun Oh, Hwaseong-si (KR); Han Sun Ryou, Seoul (KR); Man Sik Myeong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/405,054

(22) Filed: May 7, 2019

(65) Prior Publication Data
US 2019/0261524 A1    Aug. 22, 2019

Related U.S. Application Data

(63) Continuation of application No. 15/787,621, filed on Oct. 18, 2017, now Pat. No. 10,314,184.

(30) Foreign Application Priority Data

Nov. 3, 2016   (KR) .......................... 10-2016-0146023

(51) Int. Cl.
H05K 5/02       (2006.01)
G09F 9/30       (2006.01)
(Continued)

(52) U.S. Cl.
CPC ......... *H05K 5/0226* (2013.01); *G06F 1/1616* (2013.01); *G06F 1/1652* (2013.01);
(Continued)

(58) Field of Classification Search
CPC .. H05K 5/0226; H05K 5/0017; G06F 1/1681; G06F 1/1616; G06F 1/1652; G09F 9/301
See application file for complete search history.

(56) References Cited

U.S. PATENT DOCUMENTS

2010/0164837 A1*   7/2010  Kao ..................... G06F 1/1616
                                                      345/1.3
2012/0110784 A1    5/2012  Hsu et al.
(Continued)

FOREIGN PATENT DOCUMENTS

KR   10-2014-0026547 A    3/2014
KR   10-2015-0037383 A    4/2015
(Continued)

*Primary Examiner* — Rockshana D Chowdhury
(74) *Attorney, Agent, or Firm* — Lewis Roca Rothgerber Christie LLP

(57) ABSTRACT

A display device reduces or minimizes a stress applied to a display panel in a folded state. The display device includes a display panel including a bendable area; and a panel support portion combined to the display panel and including a multi-joint member to support the bendable area, and the multi-joint member includes: a plurality of hard material portions sequentially arranged in a first direction, mutually combined to be rotated with respect to one another, and including a first surface arranged toward the bendable area; and a soft material portion contacting the first surface and fixed to the plurality of hard material portions.

20 Claims, 18 Drawing Sheets

(51) Int. Cl.
    *H05K 5/00*     (2006.01)
    *G06F 1/16*     (2006.01)

(52) U.S. Cl.
    CPC ............ *G06F 1/1681* (2013.01); *G09F 9/301* (2013.01); *H05K 5/0017* (2013.01)

(56) References Cited

U.S. PATENT DOCUMENTS

| | | |
|---|---|---|
| 2012/0307423 A1 | 12/2012 | Bohn et al. |
| 2013/0037228 A1 | 2/2013 | Verschoor et al. |
| 2013/0083496 A1* | 4/2013 | Franklin ............... G06F 1/1626 361/749 |
| 2015/0055287 A1 | 2/2015 | Seo |
| 2015/0062525 A1 | 3/2015 | Hirakata |
| 2015/0146385 A1 | 5/2015 | Kim |
| 2016/0147262 A1 | 5/2016 | Lee |
| 2016/0227645 A1* | 8/2016 | Hampton ............. G06F 1/1601 |

FOREIGN PATENT DOCUMENTS

| | | |
|---|---|---|
| KR | 10-2016-0083789 A | 7/2016 |
| WO | WO 2012/167204 A2 | 12/2012 |

\* cited by examiner

DISPLAY DEVICE

CROSS-REFERENCE TO RELATED APPLICATION

This application is a continuation of U.S. patent application Ser. No. 15/787,621, filed on Oct. 18, 2017, which claims priority to and the benefit of Korean Patent Application No. 10-2016-0146023, filed on Nov. 3, 2016 in the Korean Intellectual Property Office, the entire content of each of which is incorporated herein by reference.

BACKGROUND

1. Field

Aspects of embodiments of the present disclosure relate to a display device.

2. Description of the Related Art

A flexible display panel is a display panel generated by disposing a plurality of pixels on a flexible substrate such as a plastic film, and it is easily bendable. Recently, foldable display devices using the flexible display panel have been under research and development. The foldable display device includes a panel support portion for supporting a flexible display panel. The panel support portion is configured to be changeable between a folded state and an unfolded state.

Part of the flexible display panel is bent while it is folded, and a bending degree must be less than a threshold value determined in consideration of a characteristic of a material that is weak in deformation from among a plurality of materials configuring the flexible display panel, for example, an inorganic material. The life span of the foldable display device may be longer when the stress applied to the flexible display panel is reduced while the foldable display device is folded.

The above information disclosed in this Background section is only for enhancement of understanding of the background of the described technology and, therefore, it may contain information that does not form the prior art that is already known in this country to a person of ordinary skill in the art.

SUMMARY

According to an aspect of the present disclosure, a foldable display device is provided. According to another aspect of the present disclosure, in a display device, a stress provided to a flexible display panel while the display device is folded is reduced or minimized.

According to one or more exemplary embodiments, a display device includes a display panel and a panel support portion. The display panel includes a bendable area. The panel support portion is combined to a display panel, and includes a multi-joint member to support the bendable area. The multi-joint member includes a plurality of hard material portions and soft material portions. The hard material portions are sequentially arranged in a first direction, are mutually combined to be rotated with respect to one another, and include a first surface arranged toward the bendable area. A soft material portion contacts each first surface and is fixed to the hard material portions.

The soft material portion may be provided on the first surface. The hard material portions may respectively include two second surfaces connected to respective edges of the first surface, and a third surface opposite to the first surface. The soft material portion may be on the two second surfaces and the third surface.

The multi-joint member may include a plurality of support sides facing the bendable area, and the support sides may be made of the soft material portion. In a folded state, edges of the respective support sides may receive a pressure from the bendable area, and a portion corresponding to the respective edges from among the soft material portion may be compressed and transformed by the pressure.

In an embodiment, the two soft material portions may be provided on respective sides of the first surface in the first direction. The two soft material portions may respectively include a fourth surface that is parallel to the first surface, and may form a triangular shape in a cross-sectional view. A combination of the hard material portion and the two soft material portions may form a trapezoidal shape in a cross-sectional view.

The hard material portion may be combined to the two soft material portions in a protrusion-groove configuration. The multi-joint member may include a plurality of support sides facing the bendable area. The support sides may respectively include the first surface provided in a center thereof, and the two fourth surfaces provided on respective sides of the first surface.

In the folded state, the two fourth surfaces included in the respective support sides may receive a pressure from the bendable area, and the two fourth surfaces included in the soft material portion may be compressed and transformed by the pressure.

The hard material portions may be combined to each other by a plurality of rotation combiners, and the rotation combiners may be provided outside the respective sides of the display panel in a second direction crossing the first direction. The respective rotation combiners may be configured with a hinge assembly, and the hinge assembly may include a hinge shaft about which the hard material portions are rotatable.

In an embodiment, the soft material portion may include a plate portion facing an entire side of the bendable area. The plate portion may include a plurality of overlapped portions overlapping the first surfaces of the hard material portions, and a plurality of connectors between the overlapped portions.

A side of the plate portion facing the bendable area may define a single support side of the multi-joint member. In the folded state, the connectors may be bent by an external force and may function as the rotation shaft. The connector may include a recess portion in a circular arc shape on a side that is opposite to the bendable area.

In the folded state, the connectors may receive a pressure from the bendable area and may be compressed and transformed. The hard material portions may respectively include two second surfaces connected to respective edges of the first surface, and a third surface opposite to the first surface. The soft material portion may further include an extension provided on the two second surfaces and the third surface.

The hard material portion may include a material selected from a metal and a high strength plastic, and the soft material portion may include a material selected from silicone and polyurethane.

According to an aspect of one or more exemplary embodiments, the display device may reduce the stress received by the display panel by a compressive transformation of the soft material portion. Therefore, the display device may reduce a possibility of damage of the display panel to increase the durability and life span of the product.

DETAILED DESCRIPTION

Figure 1:
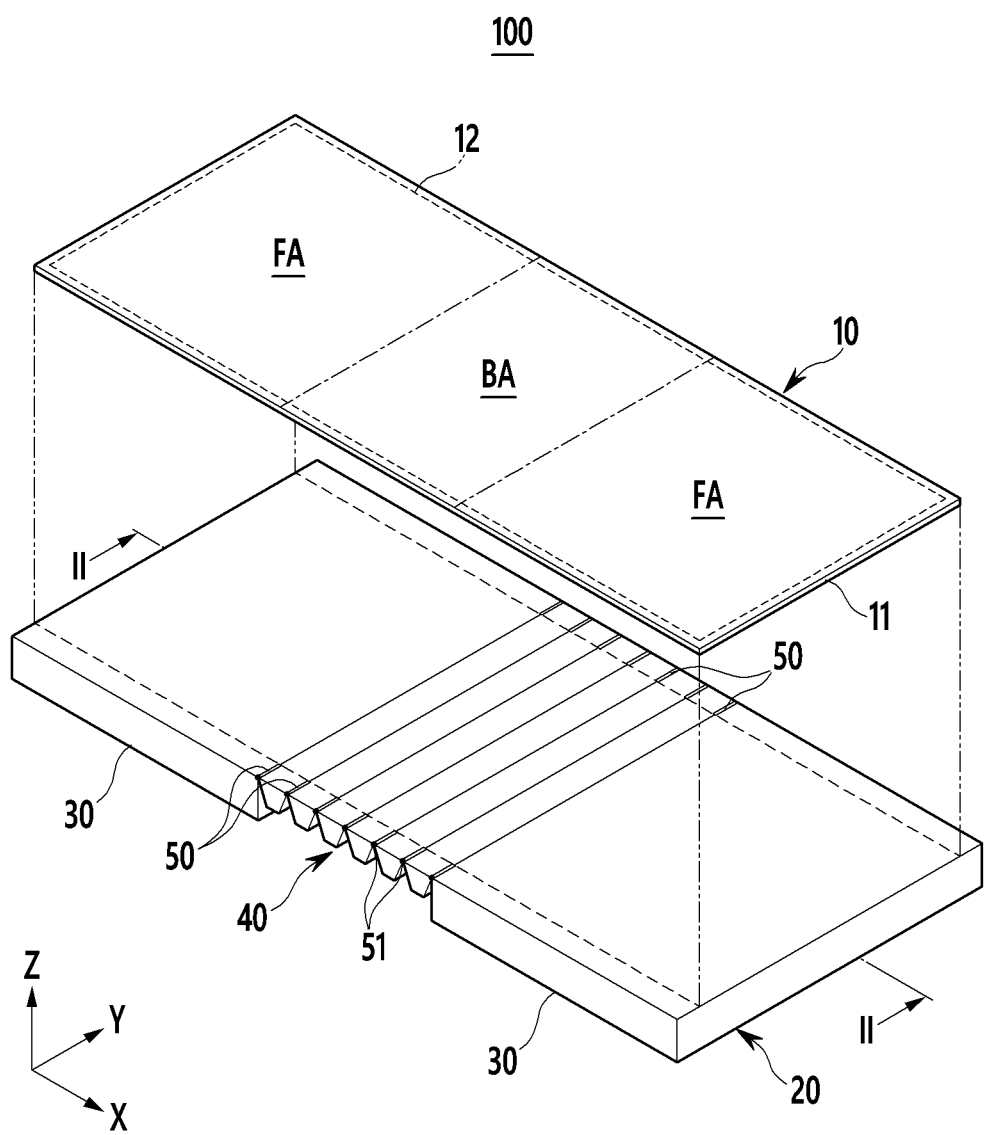
FIG. 1 shows an exploded perspective view of an unfolded state of a display device according to an exemplary embodiment.

The present disclosure will be described more fully hereinafter with reference to the accompanying drawings, in which some exemplary embodiments of the disclosure are shown. As those skilled in the art would realize, the described embodiments may be modified in various different ways without departing from the spirit or scope of the present disclosure.

Accordingly, the drawings and description are to be regarded as illustrative in nature and not restrictive. Like reference numerals designate like elements throughout the specification.

The size and thickness of each configuration shown in the drawings may be arbitrarily shown for better understanding and ease of description, and the present disclosure is not limited thereto. In the drawings, the thicknesses of layers, films, panels, areas, etc., may be exaggerated for clarity. For example, for better understanding and ease of description, the thicknesses of some layers and areas may be exaggerated.

It will be understood that when an element, such as a layer, film, area, or substrate, is referred to as being "on" another element, it may be directly on the other element or intervening elements may also be present. In contrast, when an element is referred to as being "directly on" another element, there are no intervening elements present.

The words "on" or "above" mean positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

Figure 2:
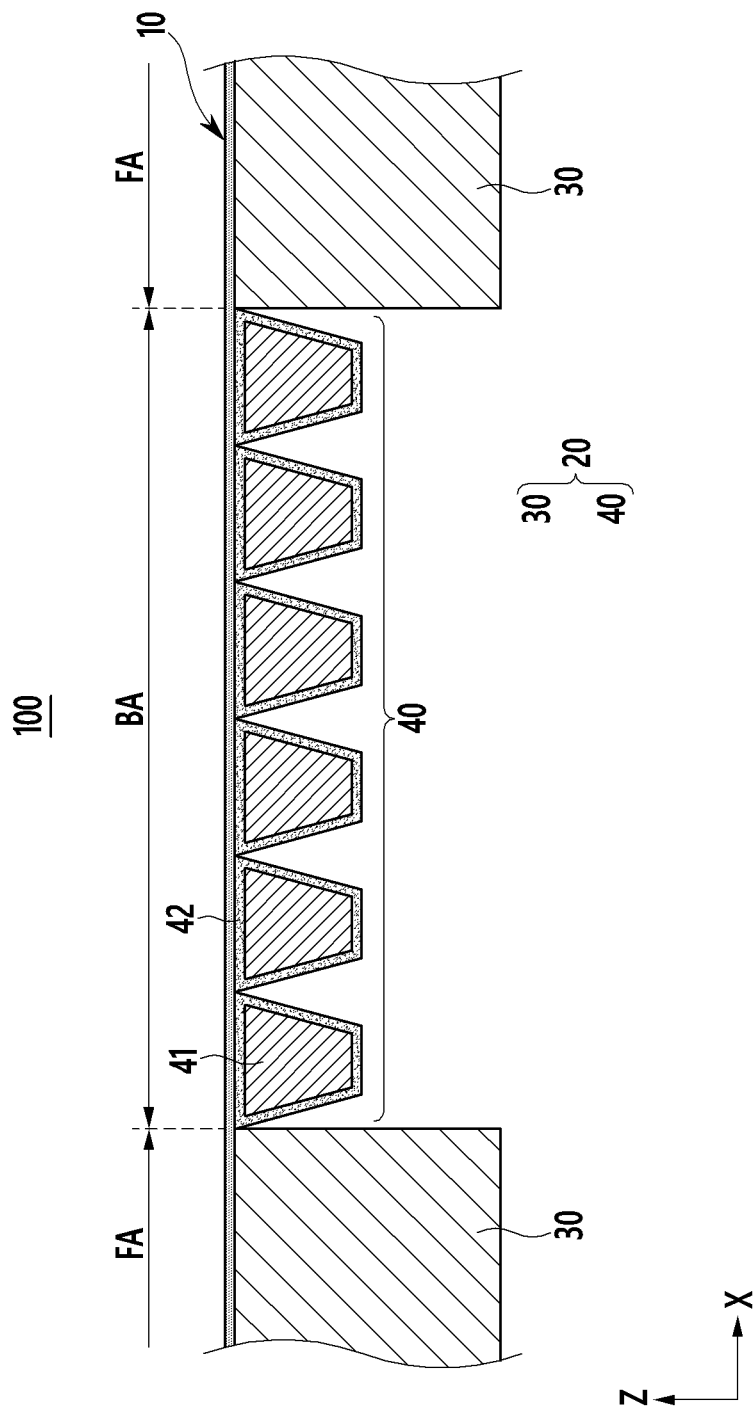
FIG. 2 shows a cross-sectional view of a combined state of a display device with respect to a line II-II of FIG. 1.

FIG. 1 shows an exploded perspective view of an unfolded state of a display device according to an exemplary embodiment; FIG. 2 shows a cross-sectional view of a combined state of a display device with respect to a line II-II of FIG. 1; and FIG. 3 shows a partial enlarged view of a display device shown in FIG. 2.

Figure 3:
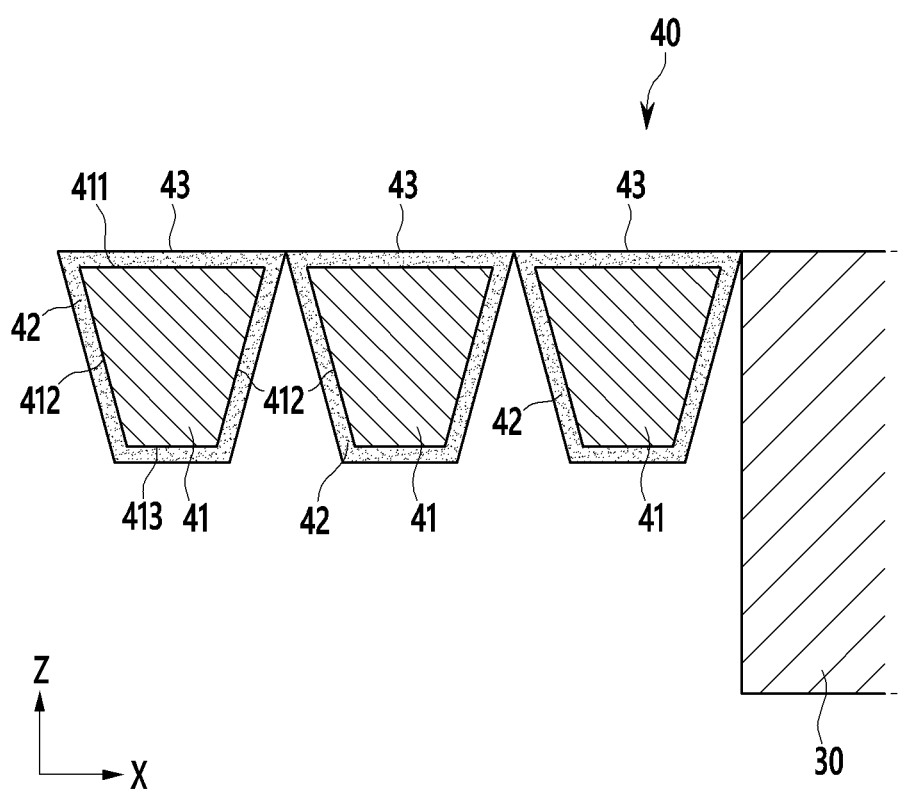
FIG. 3 shows a partial enlarged view of a display device shown in FIG. 2.

Referring to FIG. 1 to FIG. 3, a display device 100 according to an exemplary embodiment includes a display panel 10 and a panel support portion 20 combined to the display panel 10 and supporting the display panel 10.

The display panel 10 includes a flexible substrate 11 and a display unit 12 provided on the flexible substrate 11. In an embodiment, the flexible substrate 11 may include a plastic film, and the display unit 12 may include a plurality of pixels and a plurality of driving circuits. The display panel 10 may be any of an organic light emitting panel, a liquid crystal panel, and an electrophoretic display panel, but is not limited thereto.

The display panel 10 includes a flat area (FA) and a bendable area (BA). In an embodiment, for example, the display panel 10 may be divided into a bendable area (BA) provided in a center thereof, and two flat areas (FA) provided on respective sides of the bendable area (BA). Lengths of the two flat areas (FA) in a first direction (e.g., an X direction) may be equal to or different from each other.

In an embodiment, the panel support portion 20 may include two support plates 30 corresponding to the two flat areas (FA), and a multi-joint member 40 corresponding to the bendable area (BA). The multi-joint member 40 includes a plurality of hard material portions 41 sequentially arranged in the first direction (e.g., the X direction), and soft material portions 42 fixed to the hard material portions 41.

In an embodiment, the respective hard material portions 41 may have a bar shape extending in a second direction (e.g., a Y direction) crossing the first direction (e.g., the X direction), and may have a trapezoidal shape in the cross-sectional view. In an embodiment, the hard material portion 41 may include a first surface 411 provided toward the bendable area (BA), two second surfaces 412 connected to respective edges of the first surface 411, and a third surface 413 provided to be opposite to the first surface 411. In an embodiment, the second surfaces 412 are slanted sides, and the third surface 413 is shorter than the first surface 411.

The soft material portion 42 is provided on the first surface 411 of the hard material portion 41 and contacts a side of the bendable area (BA) instead of the hard material portion 41. The multi-joint member 40 includes a plurality of support sides 43 facing the bendable area (BA). The support sides 43 may contact each other and neighbor each other, and, in an exemplary embodiment, the support sides 43 are made of the soft material portion 42.

Two support plates 30 may be combined to the hard material portions 41 by a plurality of rotation combiners 50. The rotation combiners 50 may be provided to respective outsides of the display panel 10 in the second direction (e.g., the Y direction). In an embodiment, the rotation combiners 50 respectively have a rotation shaft 51, and the hard material portions 41 may be respectively rotated with respect to two rotation shafts 51.

Figure 4:
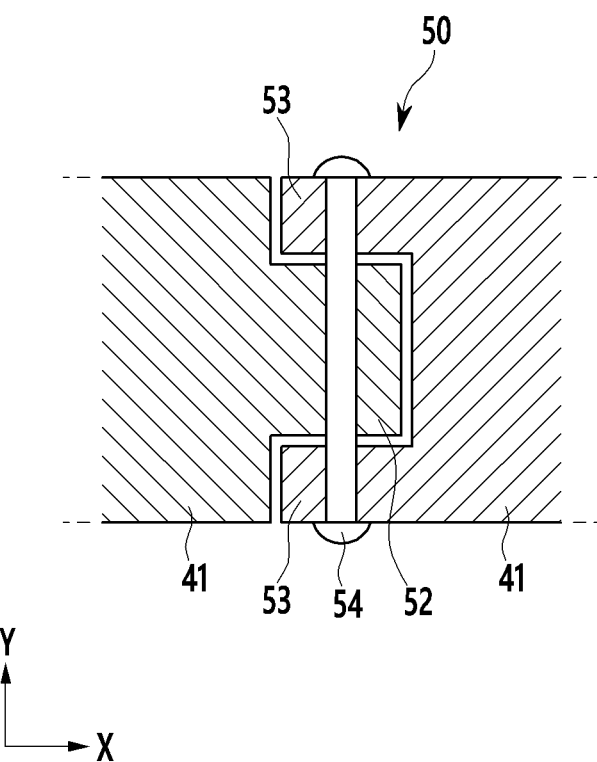
FIG. 4 shows a cross-sectional view of a rotation combiner of a display device shown in FIG. 1.

In an embodiment, the rotation combiner 50 may be configured with a hinge assembly having a hinge shaft, and, in this case, the rotation shaft 51 includes the hinge shaft. FIG. 4 shows a cross-sectional view of a rotation combiner shown in FIG. 1, according to an embodiment.

Referring to FIG. 4, the rotation combiner 50 may include a first link arm 52 connected to one of the hard material portions 41, a second link arm 53 connected to another of the hard material portions 41, and a hinge shaft 54 passing through the first link arm 52 and the second link arm 53 and combining the same. However, a configuration of the rotation combiner 50 is not limited to the illustrated example.

Referring to FIG. 1 to FIG. 3, in an embodiment, the flat area (FA) of the display panel 10 may be attached to the support plate 30 by an adhesive layer (not shown). The bendable area (BA) of the display panel 10 may not be attached to the multi-joint member 40. That is, in the unfolded state, the bendable area (BA) of the display panel 10 may maintain contact with the support sides 43 or stay slightly afloat from the support sides 43.

In an embodiment, the hard material portion 41 may include a metal, such as aluminum, or a high strength plastic. The multi-joint member 40 may have mechanical strength by the plurality of hard material portions 41. The soft material portion 42 has an elastic modulus such that it may be compressed and transformed when a pressure is applied, and may be restored to the initial state when the pressure is removed. The soft material portion 42 may include silicone or a rubber material, such as polyurethane.

The soft material portion 42 is provided on the first surface 411 of the hard material portion 41, and may be additionally provided on the second surface 412 and the third surface 413 of the hard material portion 41. FIG. 2 and FIG. 3 illustrate a case in which the soft material portion 42 covers the first surface 411, the second surfaces 412, and the third surface 413 of the hard material portion 41. When the soft material portion 42 covers the entire surface of the hard material portion 41 and not just part of the surface thereof, the process for manufacturing a multi-joint member 40 may be simplified.

Figure 5:
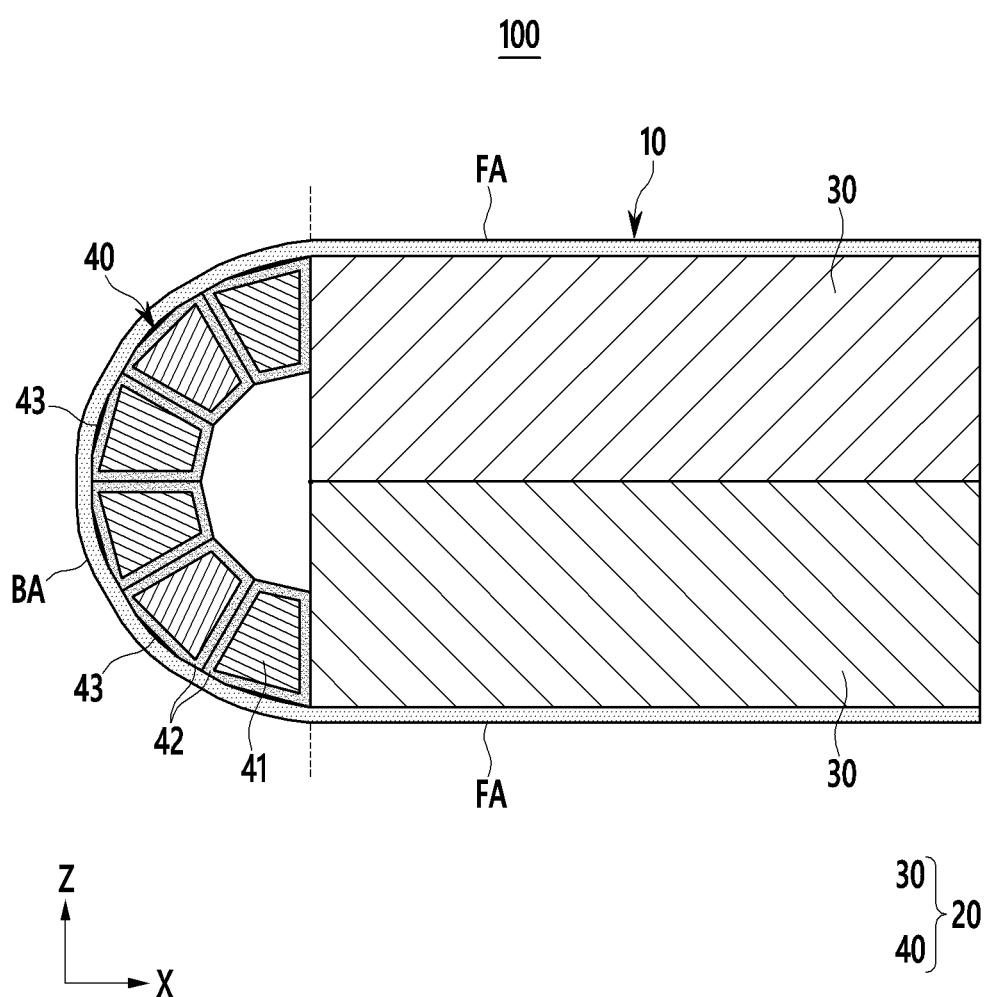
FIG. 5 shows a cross-sectional view of a folded state of a display device shown in FIG. 2.

FIG. 5 shows a cross-sectional view of a folded state of a display device shown in FIG. 2.

Referring to FIG. 5, regarding the display device 100, a plurality of hard material portions 41 rotate with respect to a rotation shaft 51, and the bendable area (BA) of the display panel 10 is bent to be an arc, such as a circular arc, and is changed into the folded state. FIG. 5 shows the multi-joint member 40 being configured having six joint members; however, the number of joint members is not limited to the illustrated example.

In an embodiment, in the folded state, the two support plates 30 face each other, and sides of the multi-joint members 40 may closely contact each other. The plurality of support sides 43 included in the multi-joint member 40 contact one side of the bendable area (BA) that is bent. In this instance, as the soft material portion 42 occupies the plurality of support sides 43, the stress applied to the display panel 10 in the folded state may be reduced or minimized by the transformation of the soft material portion 42.

Figure 6:
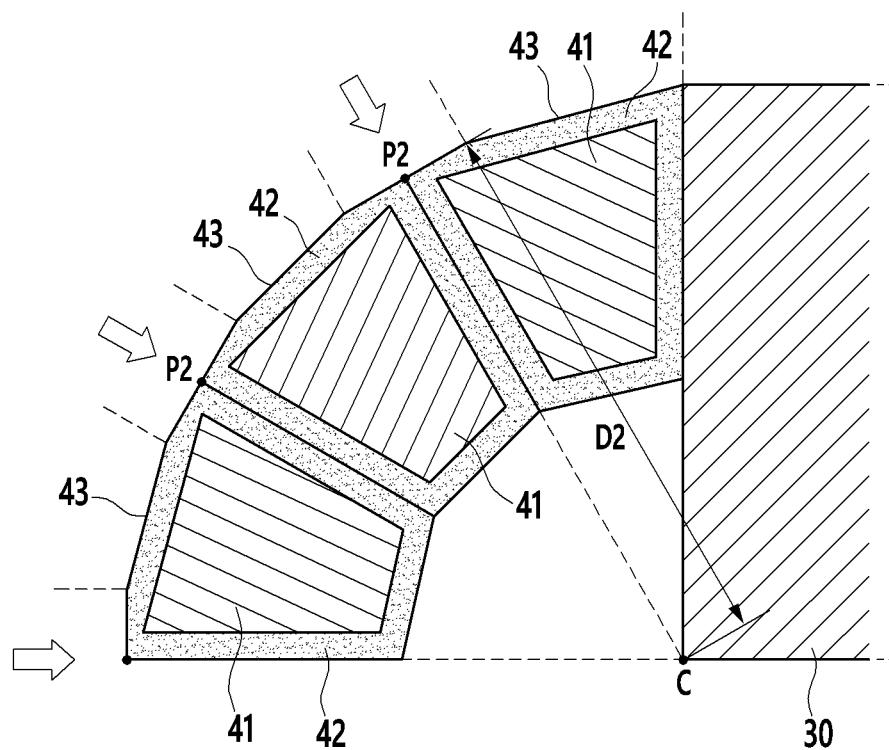
FIG. 6 shows a partial enlarged view of a display device shown in FIG. 5.
Figure 7:
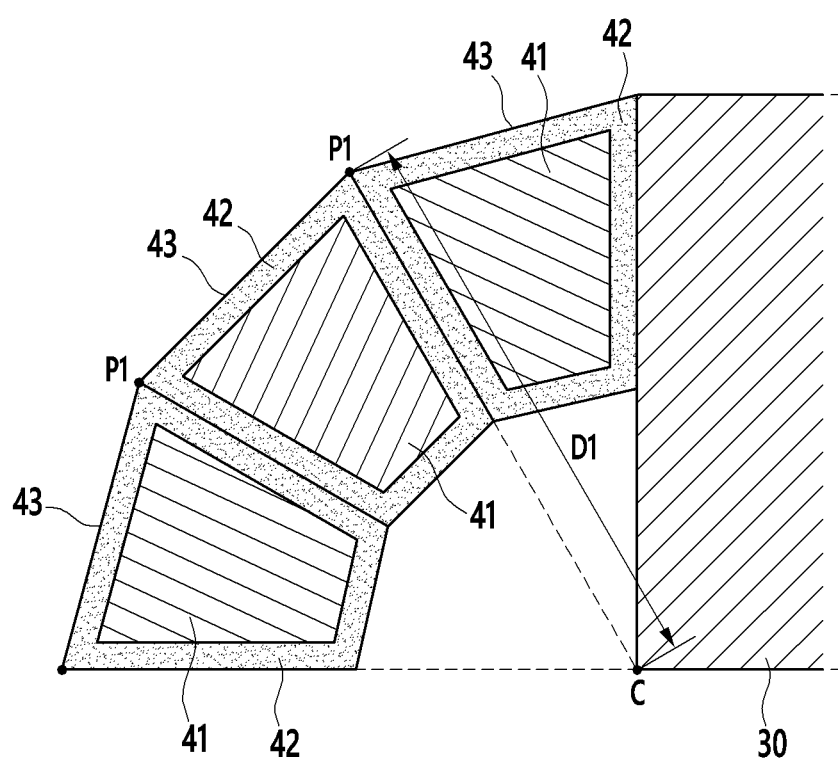
FIG. 7 shows a cross-sectional view of a multi-joint member in a case in which a display panel is removed from a display device shown in FIG. 6.

FIG. 6 shows a partial enlarged view of a display device shown in FIG. 5; and FIG. 7 shows a cross-sectional view of a multi-joint member in a case in which a display panel is removed from a display device shown in FIG. 6.

Referring to FIG. 7, in the folded state, neighboring ones of the plurality of support sides 43 included in the multi-joint member 40 contact each other at a first point P1. The first point P1 is provided from a curvature center (C) of the bendable area (not shown) that is bent by a first distance D1.

Referring to FIG. 6, in the folded state, a plurality of support sides 43 receive a pressure from the bendable area (BA) that is bent, and are transformed. The pressure applied to the support side 43 by the bendable area (BA) that is bent is highest at the respective edges of the support side 43, and the pressure is lowest at the center of the support side 43. The soft material portion 42 occupying the support side 43 is compressed and transformed at the edge of the support side 43.

In FIG. 6, a plurality of support sides 43 contact each other at the second point P2, and a second point P2 is provided from the curvature center (C) of the bendable area that is bent by a second distance D2. The second distance D2 has a smaller value than the first distance D1 shown in FIG. 7 because of the compression and transformation of the soft material portion 42.

When a pressure is applied, the soft material portion 42 is transformed to reduce the stress received by the display panel 10, and ease the tension of the bendable area (BA). Therefore, in the folded state, the display device 100 may control or reduce generation of defects and permanent transformation of the display panel 10, such as cracks or the like. The soft material portion 42 is restored into the initial form when it is changed to the unfolded state.

Figure 8:
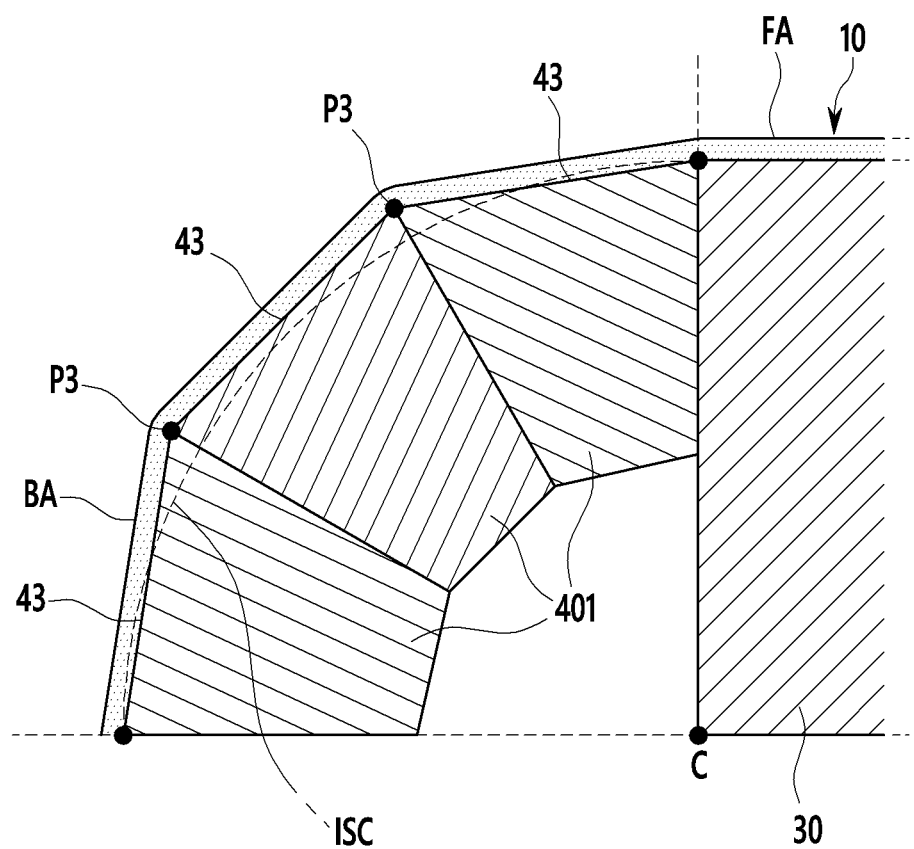
FIG. 8 shows a partial enlarged view of a folded state of a display device according to a comparative example.

FIG. 8 shows a partial enlarged view of a folded state of a display device according to a comparative example.

Referring to FIG. 8, regarding the display device according to the comparative example, a multi-joint member 401 does not include a soft material portion. That is, the multi-joint member 401 is configured with a hard material portion.

In the case of the comparative example, in the folded state, a third point P3 where a plurality of support sides 43 contact each other is provided outside a virtual circular arc (ISC) for connecting upper sides of the two support plates 30. Therefore, the multi-joint member 401 pushes the bendable area (BA) of the display panel 10 in an outward direction (i.e. a direction away from the curvature center (C)) from a plurality of third points P3 to transform the same.

The bendable area (BA) of the display panel 10 is partly bent at a portion contacting the plurality of third points P3, and the stress substantially increases at this portion. The above-noted bent transformation increases a probability of damage of a layer that is sensitive to a transformed amount from among multilayers configuring the display panel 10.

For example, the display panel 10 may be configured with multilayers including a flexible substrate, a display unit, an encapsulation layer, a touch sensor, a polarization film, and a cover window. In this instance, a hard coating layer of the cover window or an inorganic insulating layer of the display unit may have a brittle property and may be easily damaged by transformation. Therefore, regarding the display device according to the comparative example, in the folded state, it may be highly probable that a specific layer of the display panel may be damaged by a steep increase of stress.

By contrast, the display device 100 according to the exemplary embodiment may reduce the stress received by the display panel 10 in the folded state by compression and transformation of the soft material portion 42 occupying the plurality of support sides 43. Therefore, the display device 100 according to the exemplary embodiment may reduce a possibility of damage of the display panel 10 and may increase the durability and the life span of the product.

Figure 9:
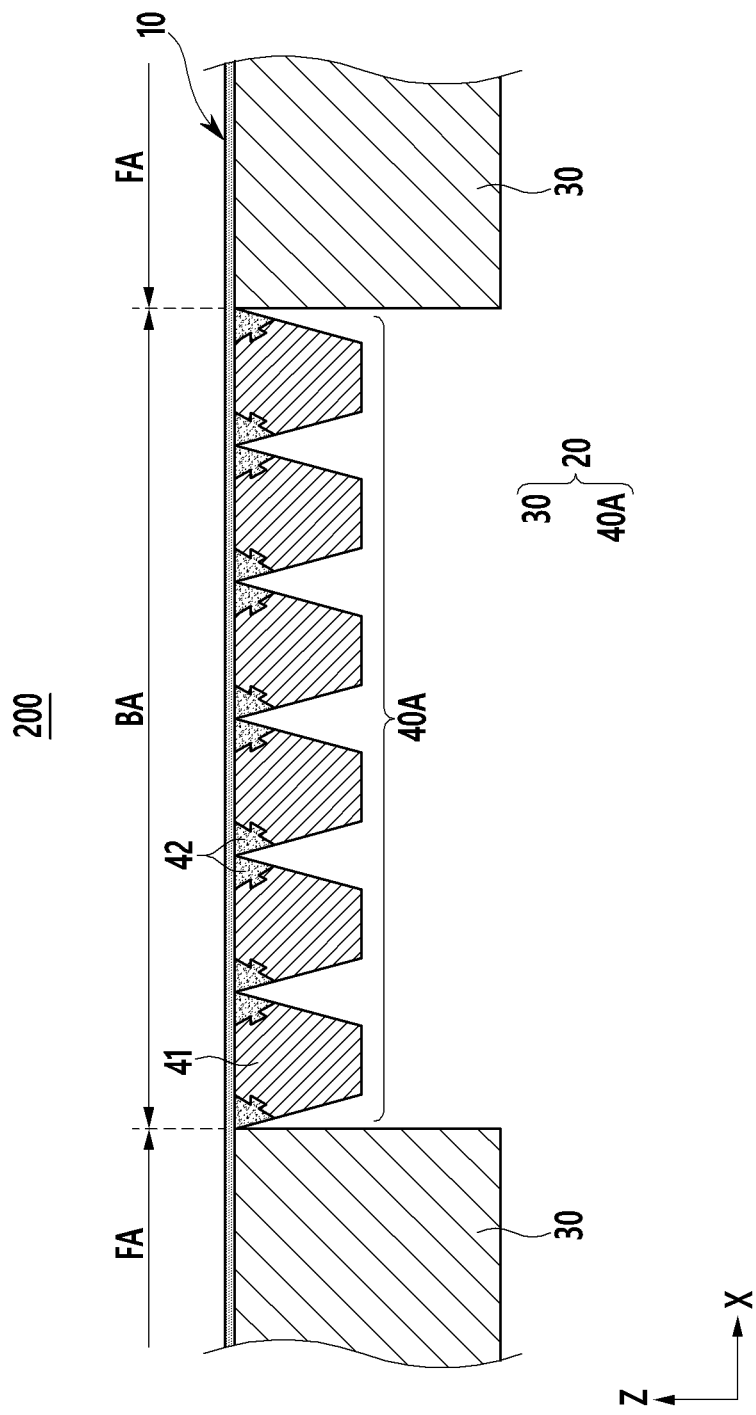
FIG. 9 shows a cross-sectional view of an unfolded state of a display device according to another exemplary embodiment.
Figure 10:
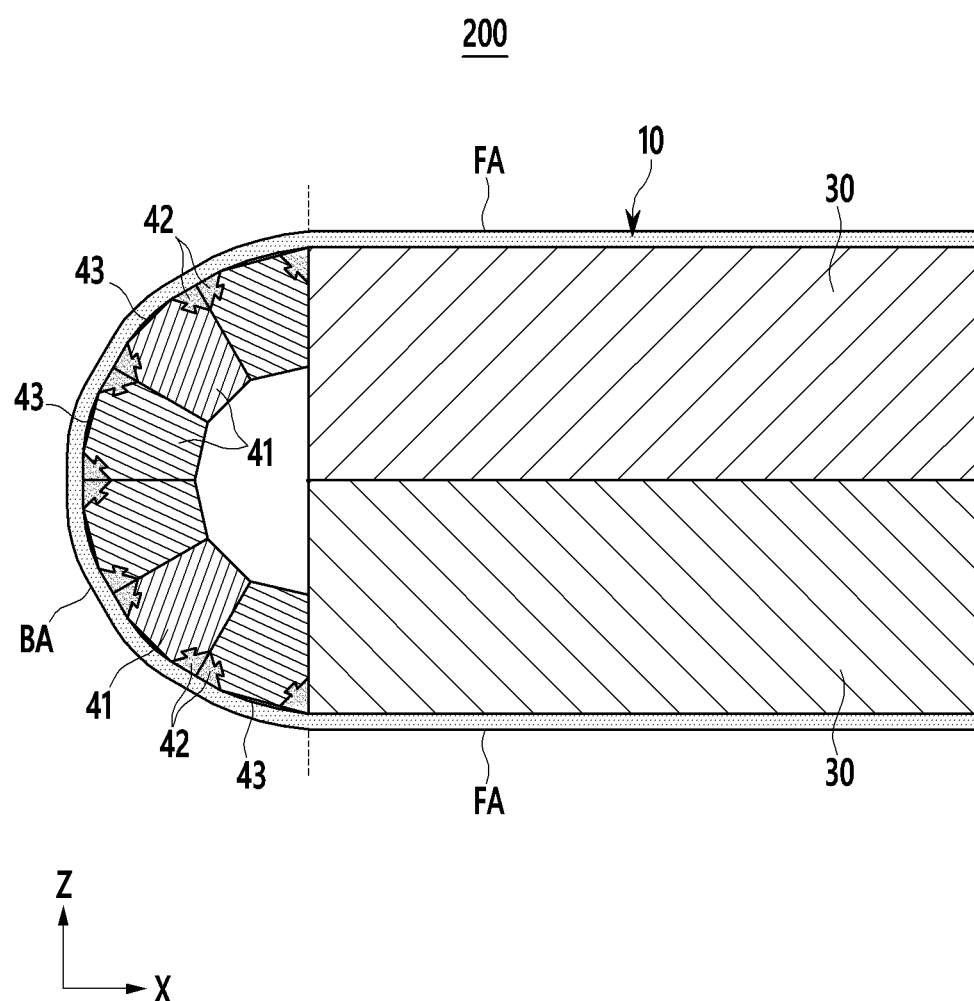
FIG. 10 shows a cross-sectional view of a folded state of a display device shown in FIG. 9.

FIG. 9 shows a cross-sectional view of an unfolded state of a display device according to another exemplary embodiment; FIG. 10 shows a cross-sectional view of a folded state of a display device shown in FIG. 9; and FIG. 11 shows a partial enlarged view of a display device shown in FIG. 10.

Figure 11:
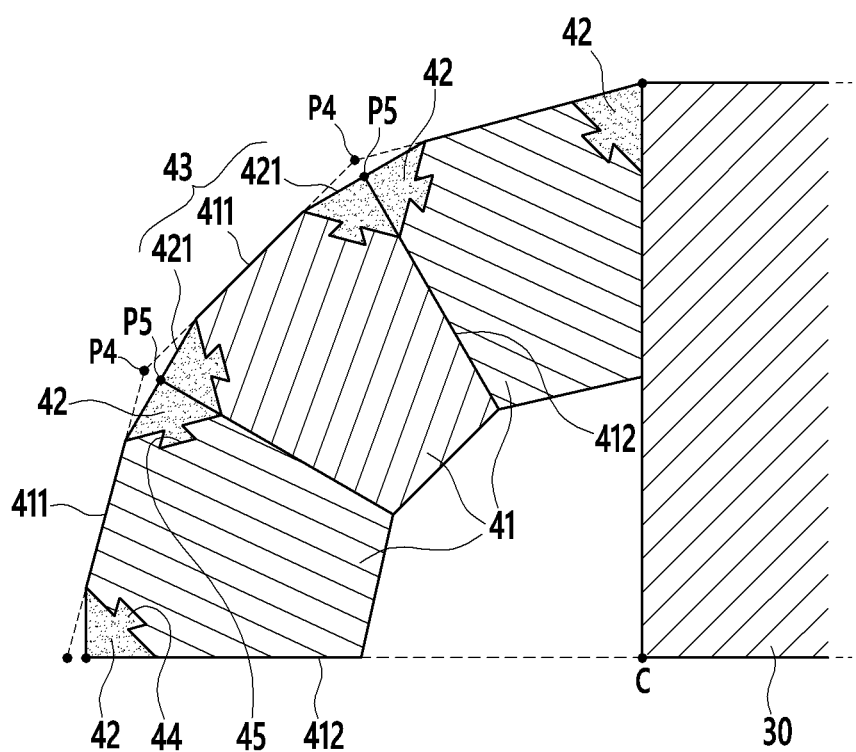
FIG. 11 shows a partial enlarged view of a display device shown in FIG. 10.

Referring to FIG. 9 to FIG. 11, regarding a display device 200 according to another exemplary embodiment, a plurality of hard material portions 41 respectively include a first surface 411 provided toward the bendable area (BA), and two soft material portions 42 contacting the first surface 411 are provided at respective sides of the first surface 411. A plurality of hard material portions 41 may respectively be substantially trapezoidal from which two upper edges are removed in a cross-sectional view. The two soft material portions 42 respectively include a fourth surface 421 that is parallel to the first surface 411.

Regarding a multi-joint member 40A according to an exemplary embodiment, a plurality of support sides 43 facing the bendable area (BA) are configured with the first surface 411 made of the hard material portion 41 and provided at the center, and two fourth surfaces 421 provided at respective sides of the first surface 411 and made of the soft material portion 42. The two soft material portions 42 may be substantially triangular in a cross-sectional view, and a combination of the hard material portion 41 and the two soft material portions 42 may be trapezoidal in a cross-sectional view.

The soft material portion 42 may be combined to the hard material portion 41 by a protrusion-groove configuration or scheme. FIG. 9 to FIG. 11 show an embodiment in which the soft material portion 42 includes a protrusion 44, the hard material portion 41 includes a groove 45, and the protrusion 44 of the soft material portion 42 is inserted into the groove 45 of the hard material portion 41.

When the display device 200 is changed to the folded state from the unfolded state, sides of the multi-joint member 40A closely contact each other, and a plurality of support sides 43 contact each other at a fourth point P4. The fourth point P4 represents a point at which the fourth surfaces 421 of two neighboring soft material portions 42 contact each other. The bendable area (BA) that is bent pressurizes the respective edges of the support side 43 such that the soft material portion 42 is compressed and transformed by the pressure.

Neighboring ones of the plurality of support sides 43 contact each other at a fifth point P5 by the transformation of the soft material portion 42. The fifth point P5 is provided closer to the curvature center (C) of the bendable area (BA) than the fourth point P4. The soft material portion 42 is compressed and transformed in the folded state to reduce the stress received by the display panel 10 and ease the tension of the bendable area (BA). The soft material portion 42 is restored to the initial state when the pressure is removed.

The display device 200 according to an exemplary embodiment is provided with a same or similar configuration as that of the above-described display device 100 except for the cross-sectional shapes of the hard material portion 41 and the soft material portion 42.

Figure 12:
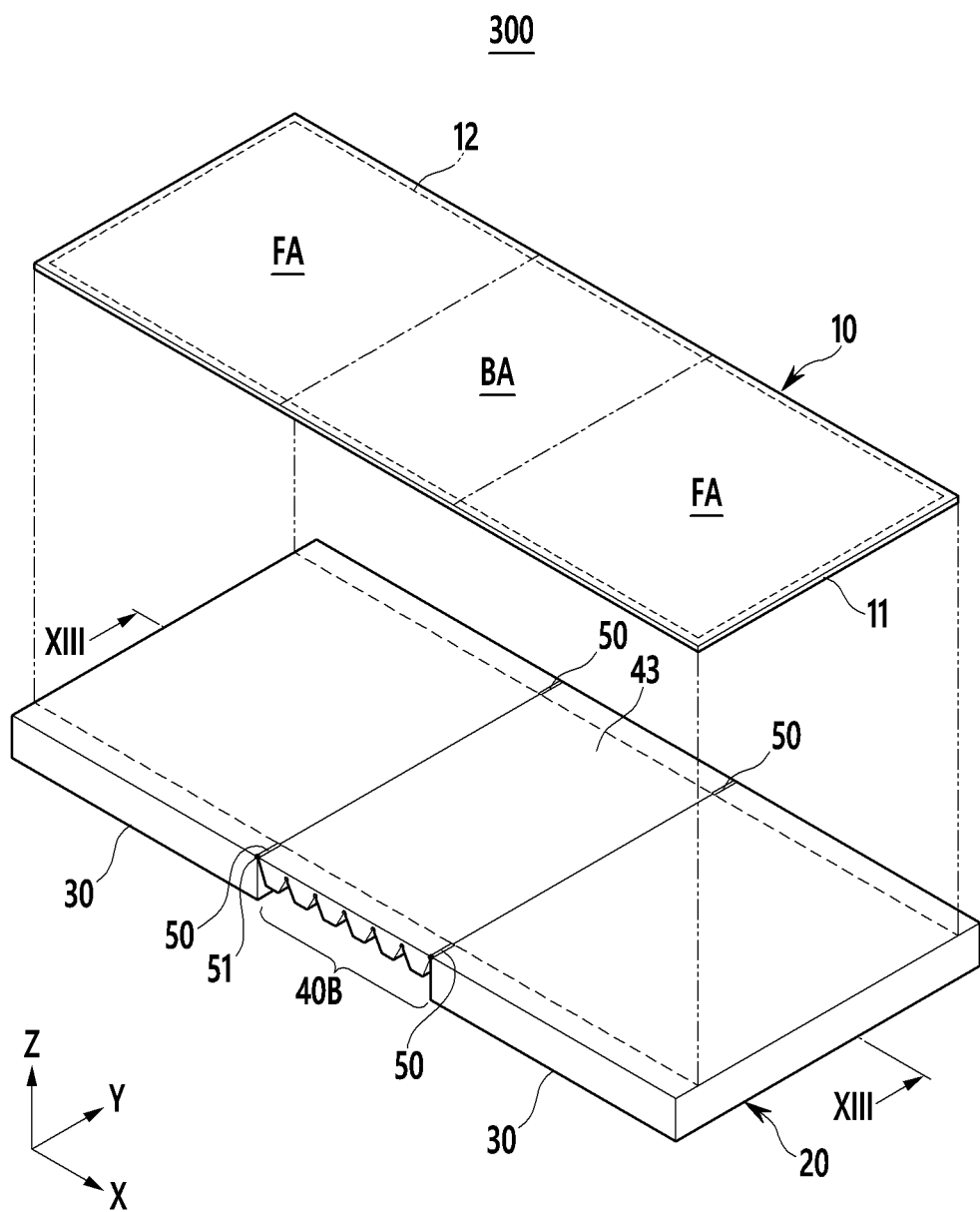
FIG. 12 shows an exploded perspective view of an unfolded state of a display device according to another exemplary embodiment.
Figure 13:
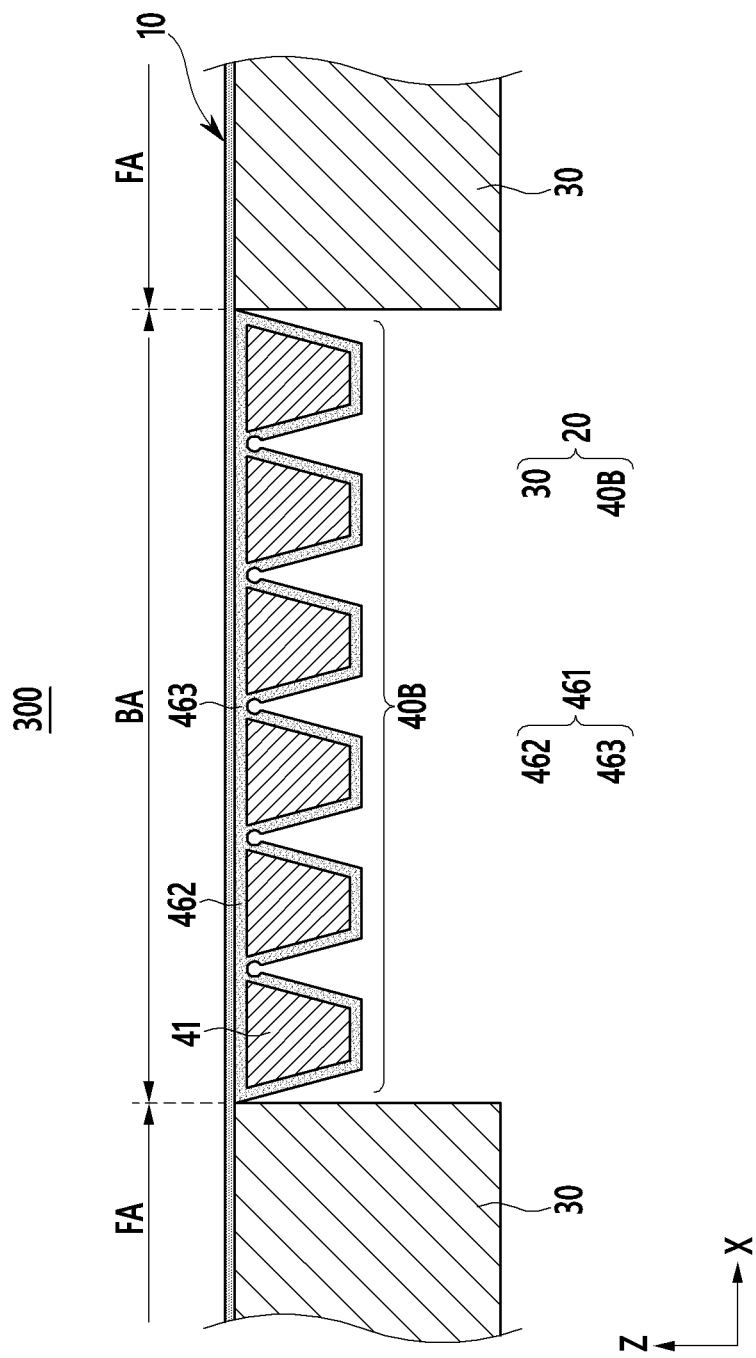
FIG. 13 shows a cross-sectional view of a combined state of a display device with respect to a line XIII-XIII of FIG. 12.

FIG. 12 shows an exploded perspective view of an unfolded state of a display device according to another exemplary embodiment; FIG. 13 shows a cross-sectional view of a combined state of a display device with respect to a line XIII-XIII of FIG. 12; and FIG. 14 shows a partial enlarged view of a display device shown in FIG. 13.

Figure 14:
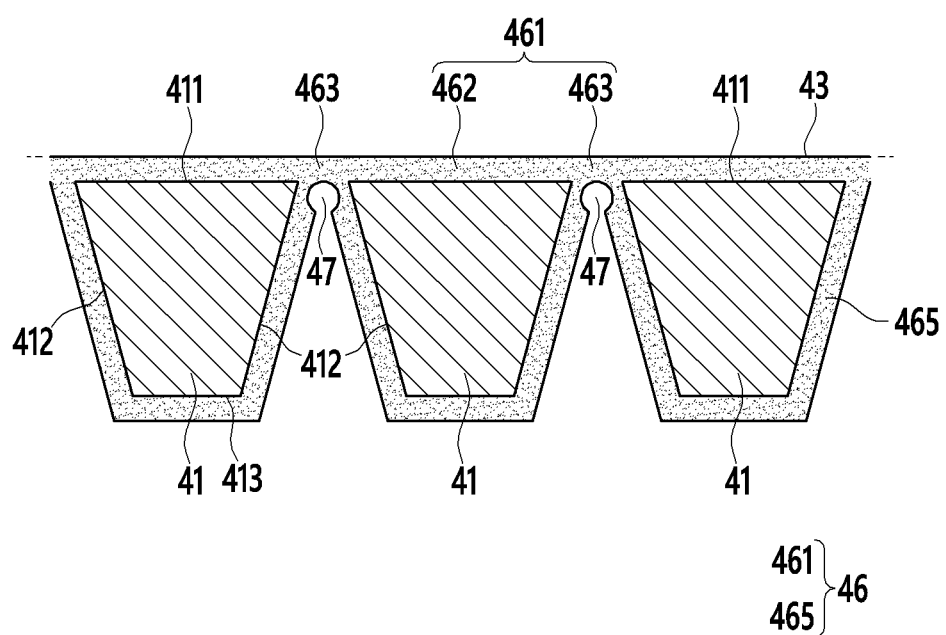
FIG. 14 shows a partial enlarged view of a display device shown in FIG. 13.

Referring to FIG. 12 to FIG. 14, regarding a display device 300 according to another exemplary embodiment, a multi-joint member 40B includes a plurality of hard material portions 41 sequentially arranged in the first direction (e.g., the X direction) with a distance therebetween, and a soft material portion 46 provided between a plurality of hard material portions 41 and a bendable area (BA) and integrally connecting a plurality of hard material portions 41.

The hard material portion 41 may include a first surface 411 provided toward the bendable area (BA), two second surfaces 412 connected to respective edges of the first surface 411, and a third surface 413 provided to be opposite to the first surface 411. In an embodiment, the second surfaces 412 are slanted sides, and the third surface 413 is shorter than the first surface 411.

In an embodiment, the soft material portion 46 may include a plate portion 461 facing an entire side of the bendable area (BA), and an extension 465 connected to the plate portion 461 and covering the second surface 412 and the third surface 413 of the plurality of hard material portions 41. The plate portion 461 may include, or be divided into, overlapped portions 462 overlapping the respective first surfaces 411 of the plurality of hard material portions 41, and a connector 463 provided between neighboring ones of the overlapped portions 462.

A multi-joint member 40B according to an exemplary embodiment includes a support side 43 formed to be a single side without a broken part, and stably supports the bendable area (BA) of the display panel 10. In this instance, the connector 463 of the soft material portion 46 may be bent by an external force, and the hard material portions 41 may rotate with respect to two connectors 463 contacting the respective edges of the first surface 411.

That is, regarding the multi-joint member 40B according to an exemplary embodiment, the connector 463 functions as a rotation shaft of the hard material portion 41. Therefore, the display device 300 according to an exemplary embodiment may omit the rotation combiner for connecting a plurality of hard material portions 41 according to the exemplary embodiment described above. The connector 463 may include a recess portion 47 in an arc shape, such as a circular arc shape, provided on an opposite side of the support side 43 so as to easily cause a bending transformation.

In an embodiment, two hard material portions 41 provided to the outermost area from among the plurality of hard material portions 41 configuring the multi-joint member 40B may be combined to two support plates 30 by the rotation combiner 50. The rotation combiner 50 may be outside the respective sides of the display panel 10 in the second direction (e.g., the Y direction) and, for example, may be configured to be a hinge assembly with a hinge shaft.

Figure 15:
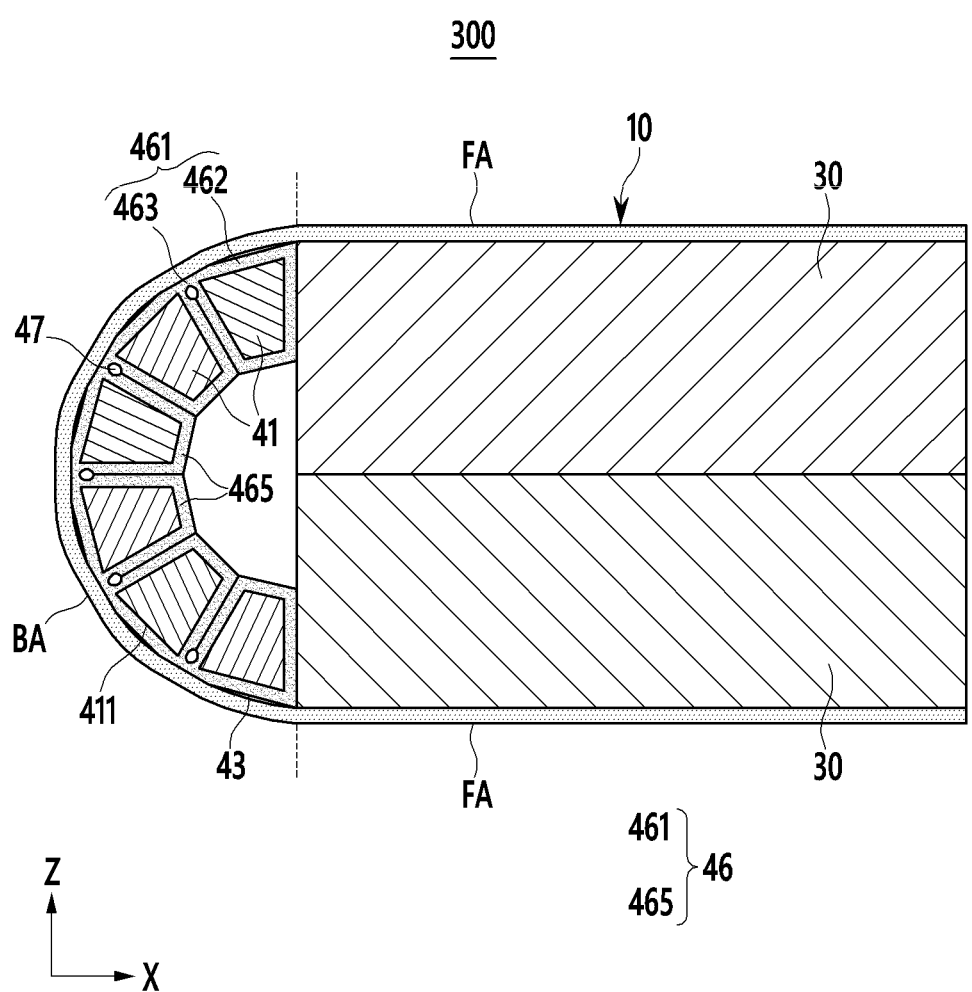
FIG. 15 shows a cross-sectional view of a folded state of a display device shown in FIG. 13.
Figure 16:
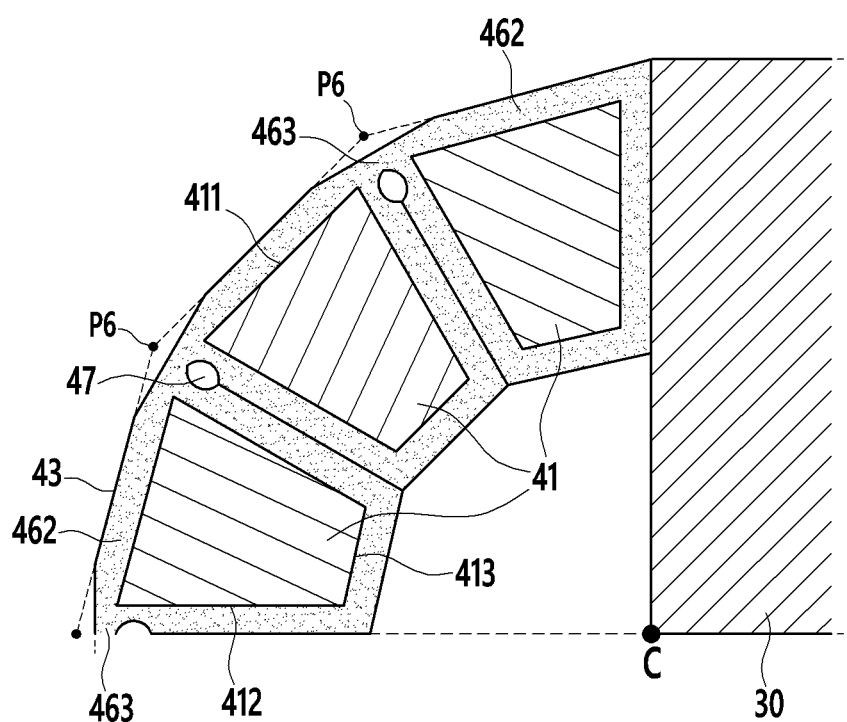
FIG. 16 shows a partial enlarged view of a display device shown in FIG. 15.

FIG. 15 shows a cross-sectional view of a folded state of a display device shown in FIG. 13; and FIG. 16 shows a partial enlarged view of a display device shown in FIG. 15.

Referring to FIG. 15 and FIG. 16, the display device 300 is changed to the folded state when the connector 463 of the soft material portion 46 is bent and the bendable area (BA) of the display panel 10 is bent in an arc shape, such as a circular arc shape. In the folded state, the sides of the multi-joint member 40B may closely contact each other, and the recess portion 47 may be formed to be oval.

In the folded state, an upper side of the connector 463 that is bent rises toward the bendable area (BA), and the bendable area (BA) that is bent applies a pressure to the connector 463 that has risen. Accordingly, the upper side of the connector 463 is compressed and transformed toward the curvature center (C) of the bendable area (BA) from the initial sixth point P6.

The display device 300 according to an exemplary embodiment may reduce the stress applied to the display panel 10 by the compression and transformation of the soft material portion 46, and may ease the tension of the bendable area (BA). The soft material portion 46 is restored into the initial form when the pressure is removed. The display device 300 according to an exemplary embodiment does not need to dispose an additional rotation combiner among a plurality of hard material portions 41 and may thus simplify the configuration of the panel support portion 20 and the manufacturing process thereof.

The display device 300 according to an exemplary embodiment is configured to be similar to the above-described display device 100 except for the configuration in which the soft material portion 46 integrally connects the plurality of hard material portions 41.

Figure 17:
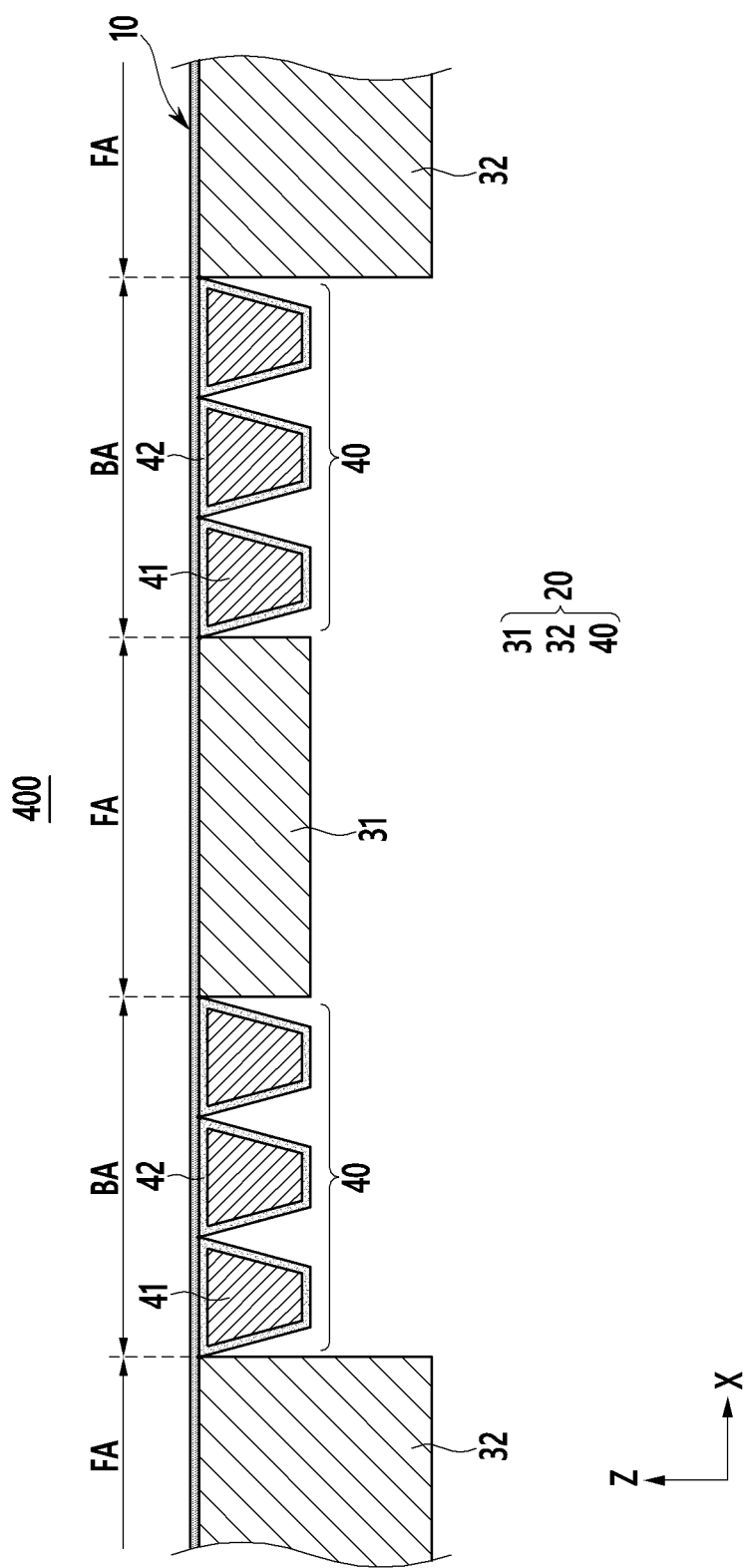
FIG. 17 shows a cross-sectional view of an unfolded state of a display device according to another exemplary embodiment.
Figure 18:
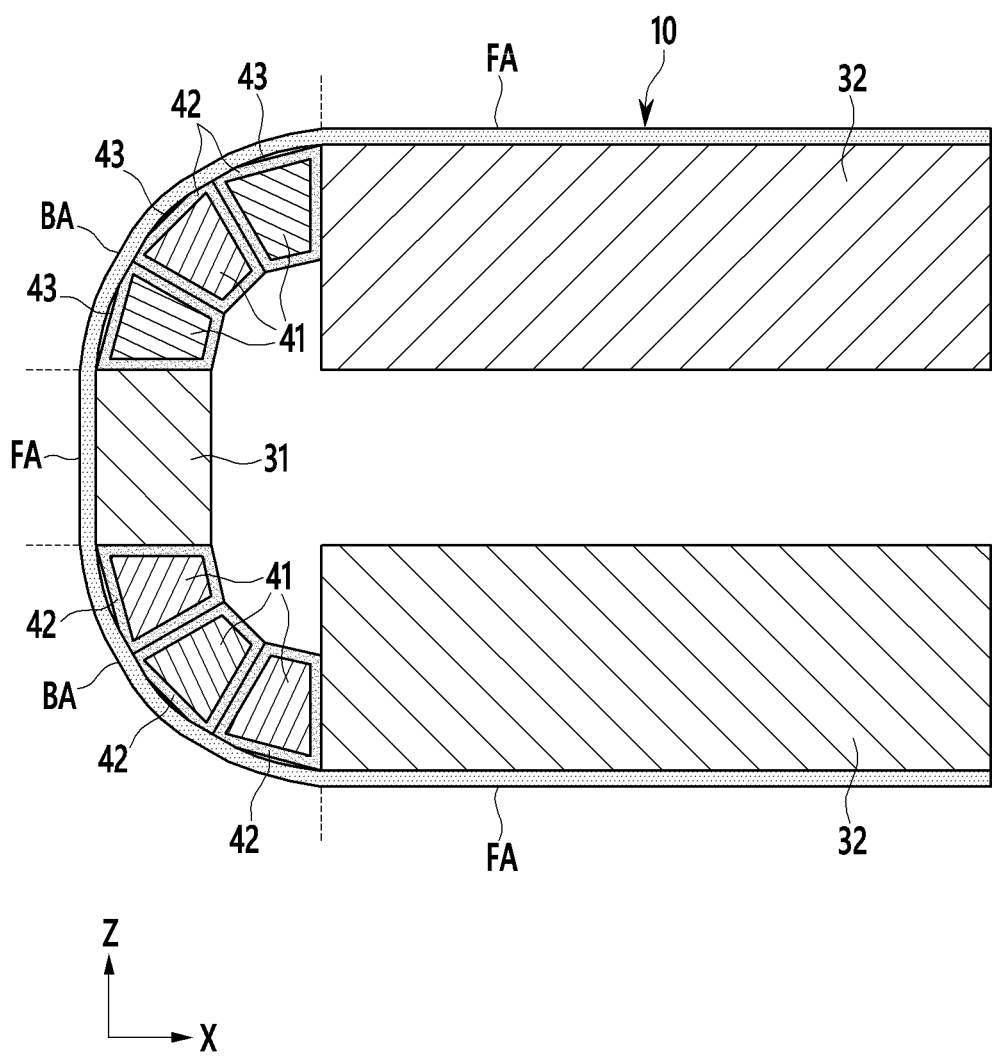
FIG. 18 shows a cross-sectional view of a folded state of a display device shown in FIG. 17.

FIG. 17 shows a cross-sectional view of an unfolded state of a display device according to another exemplary embodiment; and FIG. 18 shows a cross-sectional view of a folded state of a display device shown in FIG. 17.

Referring to FIG. 17 and FIG. 18, regarding a display device 400 according to another exemplary embodiment, the panel support portion 20 includes a center support plate 31, two multi-joint members 40 provided on respective sides of the center support plate 31, and two support plates 32 respectively provided on another side of each of the two multi-joint members 40.

In an embodiment, the center support plate 31 may be provided in the center of the panel support portion 20, and the two multi-joint members 40 and the two support plates 32 may be disposed symmetrically with respect to the center support plate 31.

The two multi-joint members 40 may be configured the same as the multi-joint member of one of the above-described exemplary embodiments except for the number of joint members. FIG. 17 and FIG. 18 show a configuration that is the same as the multi-joint member 40 described above with respect to the display device 100. The multi-joint member 40 may be combined to the center support plate 31 and the support plate 32 by a rotation combiner (not shown).

In the folded state, the two support plates 32 face each other, and sides of the multi-joint member 40 may closely contact each other. In an embodiment, a plurality of support sides 43 included in the multi-joint member 40 correspond to a circular arc that is bent by 90 degrees between the support plate 32 and the center support plate 31. The display panel 10 may be divided into three flat areas (FA) corresponding to the center support plate 31 and the two support plates 32, and two bendable areas (BA) corresponding to the two multi-joint members 40.

The display device 400 according to the present exemplary embodiment may be configured the same or similar to one of the above-described exemplary embodiments except that the multi-joint member 40 is divided into two, and the center support plate 31 is provided between the two multi-joint members 40.

While this disclosure has been described in connection with what are presently considered to be some practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
    a display panel comprising a bendable part; and
    a multi-joint member configured to support the bendable part,
    wherein the multi-joint member comprises:
        a first hard material part and a second hard material part sequentially arranged in a first direction and mutually combined to be rotated with respect to each other; and
        a soft material part comprising a first portion that is positioned between the first hard material part and the bendable part and contacts the first hard material part,
    wherein each of the first hard material part and the second hard material part comprises a first surface facing the bendable part, and a second surface connected to the respective first surface, the second surface of the first hard material part facing the second surface of the second hard material part, and
    wherein the soft material part further comprises a second portion arranged on the second surface of the first hard material part, the second portion comprising an outer surface that faces and is spaced from an outer surface of another portion of the soft material part that is arranged on the second surface of the second hard material part to define a gap between the outer surface of the second portion and the outer surface of the another portion when the display device is in an unfolded state.

2. The display device of claim 1, wherein the first portion contacts the bendable part.

3. The display device of claim 1, wherein the first portion contacts the first surface of the first hard material part.

4. The display device of claim 3, wherein the first hard material part comprises the second surface and a third surface respectively connected to one edge of the first surface and another edge of the first surface, and the second portion of the soft material part contacts at least one of the second surface and the third surface.

5. The display device of claim 4, wherein the first hard material part comprises a fourth surface opposite to the first surface, and the soft material part comprises a third portion that contacts the fourth surface.

6. The display device of claim 4, wherein the second portion is positioned between the first hard material part and the second hard material part.

7. The display device of claim 1, wherein the multi-joint member comprises a plurality of support sides facing the bendable part, and the support sides comprise a surface of the first portion.

8. The display device of claim 1, wherein the first portion is positioned between the first hard material part and the second hard material part.

9. The display device of claim 8, wherein the soft material part comprises a fourth portion, and the first portion and the fourth portion are positioned on respective sides of the first hard material part in the first direction.

10. The display device of claim 9, wherein the first portion and the fourth portion are separated from each other.

11. The display device of claim 9, wherein each of the first portion and the fourth portion has a triangular shape in a cross-sectional view, and a combination of the hard material part, the first portion, and the fourth portion forms a trapezoidal shape in a cross-sectional view.

12. The display device of claim 9, wherein the first portion and the fourth portion are combined to the hard material part in a protrusion-groove configuration.

13. The display device of claim 9, wherein the multi-joint member includes a plurality of support sides facing the bendable part, and a support side of the plurality of support sides includes a first surface of the first hard material part at a center of the support side, and a surface of the first portion and a surface of the second portion at respective sides of the first surface.

14. The display device of claim 1, wherein the first hard material part and the second hard material part are combined to each other by a rotation combiner, and the rotation combiner is arranged outside respective sides of the display panel in a second direction crossing the first direction.

15. The display device of claim 14, wherein the rotation combiner comprises a hinge assembly, and the hinge assembly comprises a hinge shaft about which the first hard material part and the second hard material part are rotatable.

16. The display device of claim 1, wherein the soft material part includes a plate portion facing an entire side of the bendable part, and the plate portion includes a first overlapped portion overlapping the first hard material part, a second overlapped portion overlapping the second hard material part, and a connector between the first overlapped portion and the second overlapped portion.

17. The display device of claim 16, wherein a side of the plate portion facing the bendable part defines a single support side of the multi-joint member.

18. The display device of claim 16, wherein the connector includes a recess in a circular arc shape at a side that is opposite to the bendable part.

19. The display device of claim 16, wherein the soft material part contacts at least two surfaces of the first hard material part.

20. The display device of claim 1, wherein the hard material part comprises a material selected from a metal and a high strength plastic, and the soft material part comprises a material selected from silicone and polyurethane.

* * * * *